United States Patent
Hirose et al.

(10) Patent No.: US 12,284,918 B2
(45) Date of Patent: Apr. 22, 2025

(54) THERMOELECTRIC CONVERSION ELEMENT, THERMOELECTRIC CONVERSION MODULE, AND METHOD OF PRODUCING THERMOELECTRIC CONVERSION ELEMENT

(71) Applicants: Sumitomo Electric Industries, Ltd., Osaka (JP); Toyota School Foundation, Nagoya (JP)

(72) Inventors: Kotaro Hirose, Osaka (JP); Masahiro Adachi, Osaka (JP); Tsunehiro Takeuchi, Nagoya (JP)

(73) Assignees: SUMITOMO ELECTRIC INDUSTRIES, LTD., Osaka. (JP); TOYOTA SCHOOL FOUNDATION, Nagoya (JP)

( * ) Notice: Subject to any disclaimer, the term of this patent is extended or adjusted under 35 U.S.C. 154(b) by 0 days.

(21) Appl. No.: 18/574,080

(22) PCT Filed: Feb. 25, 2022

(86) PCT No.: PCT/JP2022/007966
§ 371 (c)(1),
(2) Date: Dec. 26, 2023

(87) PCT Pub. No.: WO2023/276266
PCT Pub. Date: Jan. 5, 2023

(65) Prior Publication Data
US 2024/0334832 A1    Oct. 3, 2024

(30) Foreign Application Priority Data
Jun. 30, 2021   (JP) .................................. 2021-109138

(51) Int. Cl.
*H10N 10/817* (2023.01)
*H10N 10/01* (2023.01)
(Continued)

(52) U.S. Cl.
CPC .......... *H10N 10/817* (2023.02); *H10N 10/01* (2023.02); *H10N 10/82* (2023.02); *H10N 10/8556* (2023.02)

(58) Field of Classification Search
CPC .. H10N 10/817; H10N 10/8556; H10N 10/01; H10N 10/82
See application file for complete search history.

(56) References Cited

U.S. PATENT DOCUMENTS

| | | | |
|---|---|---|---|
| 2011/0016888 A1* | 1/2011 | Haa | H10N 10/17 136/200 |
| 2021/0265550 A1 | 8/2021 | Hirose et al. | |
| 2022/0416143 A1* | 12/2022 | Adachi | H10N 10/857 |

FOREIGN PATENT DOCUMENTS

| | | | | |
|---|---|---|---|---|
| JP | H 07202274 A | * | 8/1995 | ............. C01B 33/06 |
| JP | H09-172204 A | | 6/1997 | |

(Continued)

OTHER PUBLICATIONS

Ikoma et al., JPH 07202274 A, English Machine Translation, pp. 1-17. (Year: 1995).*

*Primary Examiner* — Tae-Sik Kang
(74) *Attorney, Agent, or Firm* — XSENSUS LLP (57) ABSTRACT

A thermoelectric conversion element includes a first electrode, a thermoelectric conversion material portion configured to convert heat into electricity, an intermediate layer arranged on the thermoelectric conversion material portion, a conductive bonding material arranged in between the intermediate layer and the first electrode to bond the first electrode to the intermediate layer, and a second electrode connected to the thermoelectric conversion material portion. The intermediate layer includes a first layer arranged on the thermoelectric conversion material portion and containing a dopant, and a second layer arranged on the first layer and configured to suppress diffusion of elements. The interme- (Continued)

diate layer has an interface resistivity of not less than 0.0001 mΩcm² and not more than 0.5 mΩcm².

17 Claims, 7 Drawing Sheets

(51) Int. Cl.
*H10N 10/82* (2023.01)
*H10N 10/851* (2023.01)

(56) References Cited

FOREIGN PATENT DOCUMENTS

| WO | 2019/244428 A1 | 12/2019 | |
|---|---|---|---|
| WO | WO-2021002221 A1 * | 1/2021 | ............ G01J 1/0252 |

* cited by examiner

THERMOELECTRIC CONVERSION ELEMENT, THERMOELECTRIC CONVERSION MODULE, AND METHOD OF PRODUCING THERMOELECTRIC CONVERSION ELEMENT

CROSS-REFERENCE TO RELATED APPLICATIONS

The present application is based on PCT filing PCT/JP2022/007966, filed on Feb. 25, 2022, which claims priority from Japanese Patent Application No. 2021-109138, filed on Jun. 30, 2021, the entire contents of each are incorporated herein by reference.

TECHNICAL FIELD

The present disclosure relates to a thermoelectric conversion element, a thermoelectric conversion module, and a method of producing a thermoelectric conversion element.

BACKGROUND ART

A thermoelectric device including a thermoelectric element containing silicon (Si) has been disclosed (for example, Patent Literature 1). According to the thermoelectric device disclosed in Patent Literature 1, the thermoelectric element containing Si is connected to an electrode via high melting point silicide.

CITATION LIST

Patent Literature

Patent Literature 1: Japanese Patent Application Laid-Open No. H07-202274

SUMMARY OF INVENTION

A thermoelectric conversion element according to the present disclosure includes: a first electrode; a thermoelectric conversion material portion composed of SiGe including an amorphous phase and a crystal phase, and configured to convert heat into electricity; an intermediate layer arranged on the thermoelectric conversion material portion; a conductive bonding material arranged in between the intermediate layer and the first electrode to bond the first electrode to the intermediate layer; and a second electrode arranged apart from the first electrode and connected to the thermoelectric conversion material portion. The intermediate layer includes a first layer arranged on the thermoelectric conversion material portion and containing a dopant, and a second layer arranged on the first layer and configured to suppress diffusion of elements. The intermediate layer has an interface resistivity of not less than 0.0001 m$\Omega$cm$^2$ and not more than 0.5 m$\Omega$cm$^2$.

DESCRIPTION OF EMBODIMENTS

Problems to be Solved by Present Disclosure

A thermoelectric conversion element including a thermoelectric conversion material portion for converting heat into electricity is desired to achieve high thermoelectric conversion efficiency. Therefore, one of the objects is to provide a thermoelectric conversion element capable of achieving high thermoelectric conversion efficiency.

Advantageous Effects of Present Disclosure

The thermoelectric conversion element described above is able to achieve high thermoelectric conversion efficiency.

Description Of Embodiments Of Present Disclosure

First, embodiments of the present disclosure will be listed and described. A thermoelectric conversion element according to the present disclosure includes: a first electrode; a thermoelectric conversion material portion composed of SiGe including an amorphous phase and a crystal phase and configured to convert heat into electricity; an intermediate layer arranged on the thermoelectric conversion material portion; a conductive bonding material arranged in between the intermediate layer and the first electrode to bond the first electrode to the intermediate layer; and a second electrode arranged apart from the first electrode and connected to the thermoelectric conversion material portion. The intermediate layer includes a first layer arranged on the thermoelectric conversion material portion and containing a dopant, and a second layer arranged on the first layer and configured to suppress diffusion of elements. The intermediate layer has an interface resistivity of not less than 0.0001 m$\Omega$cm$^2$ and not more than 0.5 m$\Omega$cm$^2$.

In a thermoelectric conversion element, electricity obtained in a thermoelectric conversion material portion, which converts heat (temperature differences) into electricity, is output using electrically connected first and second electrodes. Here, the present inventors considered, in the case where the thermoelectric conversion element is used at a high temperature of, e.g., several hundred degrees, the effects of reactions, occurring at portions where the electrodes are bonded to the thermoelectric conversion material portion with a bonding material, that impair the thermoelectric conversion efficiency. Diffusion of the elements constituting the bonding material into the thermoelectric conversion material portion causes deterioration of thermoelectric conversion efficiency in the thermoelectric conversion material portion. Here, it is conceivable to provide a layer configured to suppress the diffusion of the bonding material.

However, simply placing a layer for suppressing the diffusion may rather increase the contact resistance at the interface, hindering achievement of high thermoelectric conversion efficiency. The present inventors have diligently studied ways to reduce the effects of provision of this diffusion suppressing layer as much as possible, and reached the configuration of the present invention.

The thermoelectric conversion element of the present disclosure includes the thermoelectric conversion material portion composed of silicon germanium (SiGe), so high thermoelectric conversion efficiency can be achieved even when the element is used at high temperatures. The thermoelectric conversion element includes the intermediate layer which includes the first layer containing a dopant, and the second layer configured to suppress diffusion of elements. Thus, the electrical barrier between the first layer and the thermoelectric conversion material portion can be lowered, leading to reduction in contact resistance. Further, the second layer can suppress the event that the elements constituting the bonding material are diffused into the thermoelectric conversion material portion and reduce the thermoelectric conversion efficiency in the thermoelectric conversion material portion. Here, the interface resistivity of the intermediate layer is 0.0001 mΩcm$^2$ or more and 0.5 mΩcm$^2$ or less. Thus, the first layer disposed between the thermoelectric conversion material portion and the second layer can reduce the electrical barrier between the thermoelectric conversion material portion and the second layer. The contact resistance can thus be reduced. As a result, the thermoelectric conversion element of the present disclosure can achieve high thermoelectric conversion efficiency.

In the thermoelectric conversion element described above, the dopant may include at least one of P, Fe, Au, B, Ni, V, Ti, Sb, As, Ga, Mo, Y, Cu, and Zr. These elements are suitable as the element constituting the dopant contained in the first layer.

In the thermoelectric conversion element described above, the dopant may have a concentration of not less than 3 at % and not more than 20 at %. This can more reliably reduce the resistance to achieve high thermoelectric conversion efficiency.

In the thermoelectric conversion element described above, the second layer may be composed of at least one of iron silicide, nickel silicide, and titanium boride. These compounds can more efficiently suppress the diffusion of the elements constituting the bonding material.

In the thermoelectric conversion element described above, the first layer may have a thickness of not less than 10 nm and not more than 1 mm. If the first layer is too thin, when there are irregularities in the end surfaces of the second layer and the thermoelectric conversion material portion, the second layer may directly contact the thermoelectric conversion material portion, leading to increased contact resistance. If the first layer is too thick, a temperature difference may occur in the first layer, which may decrease the effective temperature difference applied to the thermoelectric conversion material portion, leading to reduced power generation. Therefore, setting the thickness of the first layer to 10 nm or more and 1 mm or less can reduce the risks of increase in contact resistance and reduction in power generation.

A thermoelectric conversion module of the present disclosure includes a plurality of the thermoelectric conversion elements described above. According to the thermoelectric conversion module of the present disclosure, by the inclusion of a plurality of thermoelectric conversion elements of the present disclosure capable of achieving high thermoelectric conversion efficiency, a thermoelectric conversion module that is able to achieve high thermoelectric conversion efficiency can be obtained.

A method of producing a thermoelectric conversion element of the present disclosure includes the steps of: obtaining a first mixture by mixing Si powder, Ge powder, and powder constituting a dopant of SiGe as a semiconductor material; obtaining a second mixture by mixing Si powder and raw material powder constituting a layer configured to suppress diffusion of elements; obtaining a sintered material by arranging the first mixture on the second mixture and performing spark plasma sintering while maintaining the first mixture and the second mixture at a temperature of not lower than 400° C. and applying a pressure of not less than 20 MPa and not more than 1 GPa; and bonding electrodes to the sintered material.

According to the method of producing the thermoelectric conversion element of the present disclosure, the thermoelectric conversion element having the above-described configuration can be produced efficiently.

DETAILS OF EMBODIMENTS OF PRESENT DISCLOSURE

Embodiments of the thermoelectric conversion element of the present disclosure will be described below with reference to the drawings. In the drawings referenced below; the same or corresponding portions are denoted by the same reference numerals and the description thereof will not be repeated.

Embodiment 1

Figure 1:
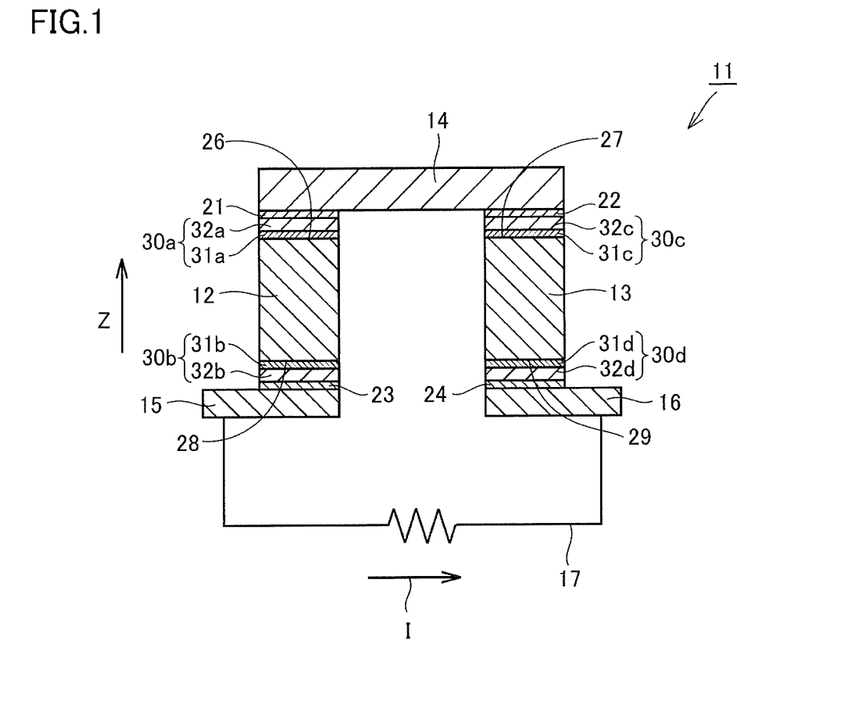
FIG. 1 is a schematic cross-sectional view showing the structure of a thermoelectric conversion element according to Embodiment 1.
Figure 2:
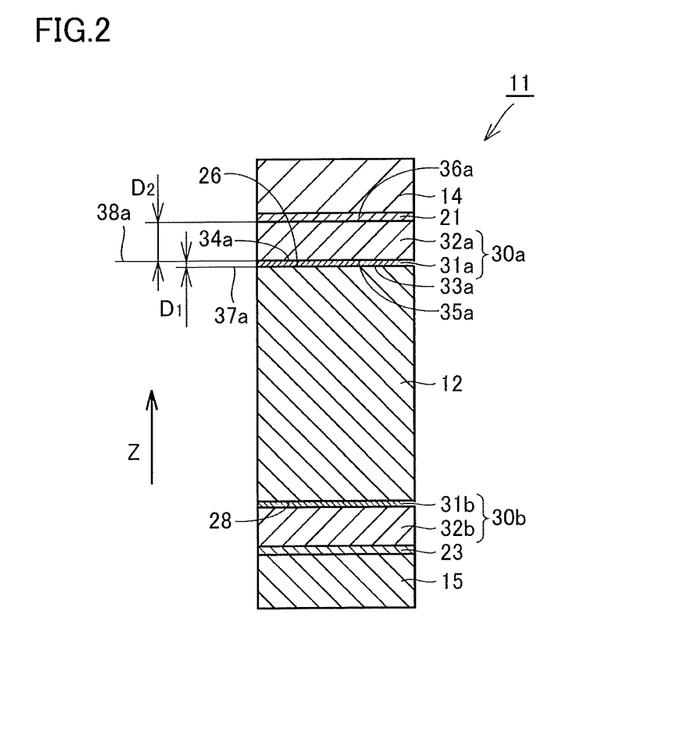
FIG. 2 is an enlarged schematic cross-sectional view of a portion of the thermoelectric conversion element shown in FIG. 1.

An embodiment, Embodiment 1, of the thermoelectric conversion element according to the present disclosure will be described with reference to FIG. 1. FIG. 1 is a schematic cross-sectional view showing the structure of the thermoelectric conversion element according to Embodiment 1. FIG. 2 is an enlarged schematic cross-sectional view of a portion of the thermoelectric conversion element shown in FIG. 1. It should be noted that first and second electrodes are illustrated in simplified form in FIG. 2 for ease of understanding.

Referring to FIGS. 1 and 2, a thermoelectric conversion element 11 is a so-called π type thermoelectric conversion element. The thermoelectric conversion element 11 of the present disclosure is used in a temperature range of relatively high temperatures of several hundred degrees, for example. The thermoelectric conversion element 11 includes a p type thermoelectric conversion material portion 12, which is a first thermoelectric conversion material portion, an n type thermoelectric conversion material portion 13, which is a second thermoelectric conversion material portion, intermediate layers 30a, 30b, 30c, and 30d, a first electrode 14 arranged on a high temperature side, a second electrode 15 arranged on a low temperature side, a second electrode 16 also arranged on the low temperature side, a conductive bonding material 21, 22, 23, 24, and a wire 17. The intermediate layers 30a, 30b, 30c, and 30d include first layers 31a, 31b, 31c, and 31d, which are disposed on the thermoelectric conversion material portions 12 and 13 and containing a dopant, and second layers 32a, 32b, 32c, and 32d, which are disposed on the first layers 31a, 31b, 31c, and 31d and configured to suppress diffusion of elements.

The thermoelectric conversion material portions 12 and 13 are composed of SiGe that includes an amorphous phase and a crystal phase. The thermoelectric conversion material portions 12 and 13 are configured to convert heat (temperature differences) into electricity. The thermoelectric conversion material portion 12 is composed of a thermoelectric conversion material having a component composition adjusted so as to have p type conductivity, for example. The thermoelectric conversion material portion 13 is composed of a thermoelectric conversion material having a component composition adjusted so as to have n type conductivity, for example.

The first layers 31a and 31b are disposed on the thermoelectric conversion material portion 12. Specifically, the first layer 31a is disposed on one end 26 of the thermoelectric conversion material portion 12. An interface between the first layer 31a and the thermoelectric conversion material portion 12 is indicated by a boundary 37a. The first layer 31b is disposed on another end 28 of the thermoelectric conversion material portion 12. The first layers 31c and 31d are disposed on the thermoelectric conversion material portion 13. Specifically, the first layer 31c is disposed on one end 27 of the thermoelectric conversion material portion 13. The first layer 31d is disposed on another end 29 of the thermoelectric conversion material portion 13. The first layers 31a, 31b, 31c, and 31d are material layers containing a dopant. It should be noted that a direction from the end 28 to the end 26 is indicated by the arrow Z.

The first layer 31a has a thickness $D_1$, from one end 33a to another end 34a of the first layer 31a in the Z direction, of not less than 10 nm (nanometers) and not more than 1 mm (millimeter). In the present embodiment, the thickness $D_1$ of the first layer 31a is 70 μm (micrometers). The first layer 31a contains phosphorus (P) as a dopant. It should be noted that the dopant contained in the first layer 31a is not limited to P. The first layer 31a may contain at least one of P, iron (Fe), gold (Au), boron (B), nickel (Ni), vanadium (V), titanium (Ti), antimony (Sb), arsenic (As), gallium (Ga), molybdenum (Mo), yttrium (Y), copper (Cu), and zirconium (Zr) as a dopant. The dopant contained in the first layer 31a is determined in accordance with the conductivity type, for example, of the thermoelectric conversion material portion 12. The concentration of P as a dopant is not less than 3 at % and not more than 20 at %. The other first layers 31b, 31c, and 31d each have a similar configuration as the first layer 31a, so the description thereof will be omitted.

The second layers 32a, 32b, 32c, and 32d are disposed on the first layers 31a, 31b, 31c, and 31d, respectively. An interface between the first layer 31a and the second layer 32a is indicated by a boundary 38a. The second layers 32a, 32b, 32c, and 32d are arranged in contact with the bonding material 21, 22, 23, 24. The second layers 32a, 32b, 32c, and 32d are each configured to suppress diffusion of elements. Specifically, with the second layers 32a, 32b, 32c, and 32d, diffusion of the elements constituting the bonding material 21, 22, 23, 24 into the thermoelectric conversion material portions 12 and 13 is suppressed.

The second layer 32a has a thickness $D_2$, from one end 35a to another end 36a of the second layer 32a in the Z direction, of not less than 50 nm and not more than 1 mm. In the present embodiment, the thickness $D_2$ of the second layer 32a is 700 μm. The second layer 32a is composed of iron silicide (Fe—Si). It should be noted that, not limited to iron silicide, the second layer 32a may be composed of at least one of iron silicide, nickel silicide (Ni—Si), and titanium boride (TiB). The configuration of the second layer 32a is determined in accordance with the type of the bonding material 21, 22, 23, 24, the elements contained in the bonding material 21, 22, 23, 24, or the like. The other second layers 32b, 32c, and 32d each have a similar configuration as the second layer 32a, so the description thereof will be omitted.

The conductive bonding material 21, 22, 23, 24 contains at least one of silver (Ag), copper (Cu), titanium (Ti), and tin (Sn) as the principal component. Specific examples of the bonding material used as the bonding material 21, 22, 23, 24 include an Ag—Cu bonding material containing Ag and Cu as the principal components, an Ag—Cu—Ti based bonding material containing Ag, Cu, and Ti as the principal components, an Ag—Cu—Ti—Sn based bonding material containing Ag, Cu, Ti, and Sn as the principal components, and a bonding material composed of an inorganic binder containing Ag as the principal component. The conductive bonding material 21, 22, 23, 24 for bonding the first electrode 14 and the second electrodes 15 and 16 to the intermediate layers 30a, 30b, 30c, and 30d contains at least one of Ag, Cu, Ti, and Sn as the principal component, thus providing good conductivity. It is therefore possible to reduce the power loss when electricity converted from heat (temperature differences) by the thermoelectric conversion material portions 12 and 13 is transmitted to the first electrode 14 and the second electrodes 15 and 16, which are bonded via the intermediate layers 30a, 30b, 30c, and 30d respectively by the bonding material 21, 22, 23, 23.

The thermoelectric conversion material portion 12 and the thermoelectric conversion material portion 13 are arranged side by side with spacing therebetween. The first electrode 14 is arranged to extend from the one end 26 of the thermoelectric conversion material portion 12 to the one end 27 of the thermoelectric conversion material portion 13. The bonding material 21 bonds the first electrode 14 to the intermediate layer 30a. The first electrode 14 is bonded to the thermoelectric conversion material portion 12 via the intermediate layer 30a by the bonding material 21. The bonding material 22 bonds the first electrode 14 to the intermediate layer 30c. The first electrode 14 is bonded to the thermoelectric conversion material portion 13 via the intermediate layer 30c by the bonding material 22. The first electrode 14 is composed of a conductive material, such as molybdenum (Mo) or other metal.

The second electrode 15 is arranged spaced apart from the first electrode 14 and from the other second electrode 16. The bonding material 23 bonds the second electrode 15 to the intermediate layer 30b. The second electrode 15 is bonded to the thermoelectric conversion material portion 12 via the intermediate layer 30b by the bonding material 23. The second electrode 15 is composed of a conductive material, such as Mo or other metal.

The second electrode 16 is arranged spaced apart from the first electrode 14. The bonding material 24 bonds the second electrode 16 to the intermediate layer 30d. The second electrode 16 is bonded to the thermoelectric conversion material portion 13 via the intermediate layer 30d by the bonding material 24. The second electrode 16 is composed of a conductive material, such as Mo or other metal.

The wire 17 is composed of a metal or other electric conductor. The wire 17 electrically connects the second electrode 15 to the second electrode 16.

In the thermoelectric conversion element 11, when a temperature difference is formed so that the one end 26 side of the thermoelectric conversion material portion 12 and the one end 27 side of the thermoelectric conversion material portion 13 attain a high temperature and the other end 28 side of the thermoelectric conversion material portion 12 and the other end 29 side of the thermoelectric conversion material portion 13 attain a low temperature, for example, then p type carriers (holes) move from the one end 26 side toward the other end 28 side in the thermoelectric conversion material portion 12. At this time, in the thermoelectric conversion material portion 13, n type carriers (electrons) move from the one end 27 side toward the other end 29 side. As a result, a current flows through the wire 17 in the direction of the arrow I. In this manner, power generation by thermoelectric conversion utilizing temperature differences is achieved in the π type thermoelectric conversion element 11. In other words, the thermoelectric conversion element 11 is a power generation element.

Here, the thermoelectric conversion element 11 is able to achieve high thermoelectric conversion efficiency even when used at high temperatures because the element includes the thermoelectric conversion material portions 12 and 13 composed of silicon germanium (SiGe). The thermoelectric conversion element 11 includes the intermediate layers 30a, 30b, 30c, and 30d which include the first layers 31a, 31b, 31c, and 31d containing a dopant and the second layers 32a, 32b, 32c, and 32d configured to suppress diffusion of elements. Thus, the electrical barriers between the first layers 31a, 31b, 31c, and 31d and the thermoelectric conversion material portions 12 and 13 can be lowered, leading to reduction in contact resistance. Further, the second layers 32a, 32b, 32c, and 32d can suppress reduction of the thermoelectric conversion efficiency in the thermoelectric conversion material portions 12 and 13 due to diffusion of the elements constituting the bonding material 21, 22, 23, 24 into the thermoelectric conversion material portions 12 and 13. Here, the interface resistivity of the intermediate layers 30a, 30b, 30c, and 30d is 0.0001 mΩcm$^2$ or more and 0.5 mΩcm$^2$ or less. Thus, the first layers 31a, 31b, 31c, and 31d disposed between the thermoelectric conversion material portions 12 and 13 and the second layers 32a, 32b, 32c, and 32d can reduce the electrical barriers between the thermoelectric conversion material portions 12 and 13 and the second layers 32a, 32b, 32c, and 32d. The contact resistance can thus be reduced. As a result, the thermoelectric conversion element 11 of the present disclosure is able to achieve high thermoelectric conversion efficiency.

According to the present embodiment, the dopant concentration is 3 at % or more and 20 at % or less. This can reduce the resistance more reliably, thereby achieving high thermoelectric conversion efficiency.

According to the present embodiment, the thickness $D_1$ of the first layers 31a, 31b, 31c, and 31d is 10 nm or more and 1 mm or less. If the first layers 31a, 31b, 31c, and 31d are too thin, when there are irregularities in the end surfaces of the second layers 32a, 32b, 32c, and 32d and the thermoelectric conversion material portions 12 and 13, the second layers 32a, 32b, 32c, and 32d may directly contact the thermoelectric conversion material portions 12 and 13, leading to increased contact resistance. If the first layers 31a, 31b, 31c, and 31d are too thick, a temperature difference may occur in the first layers 31a, 31b, 31c, and 31d, which may decrease the effective temperature difference applied to the thermoelectric conversion material portions 12 and 13, leading to reduced power generation. Therefore, setting the thickness of the first layers 31a, 31b, 31c, and 31d to 10 nm or more and 1 mm or less can reduce the risks of increase in contact resistance and reduction in power generation.

Figure 3:
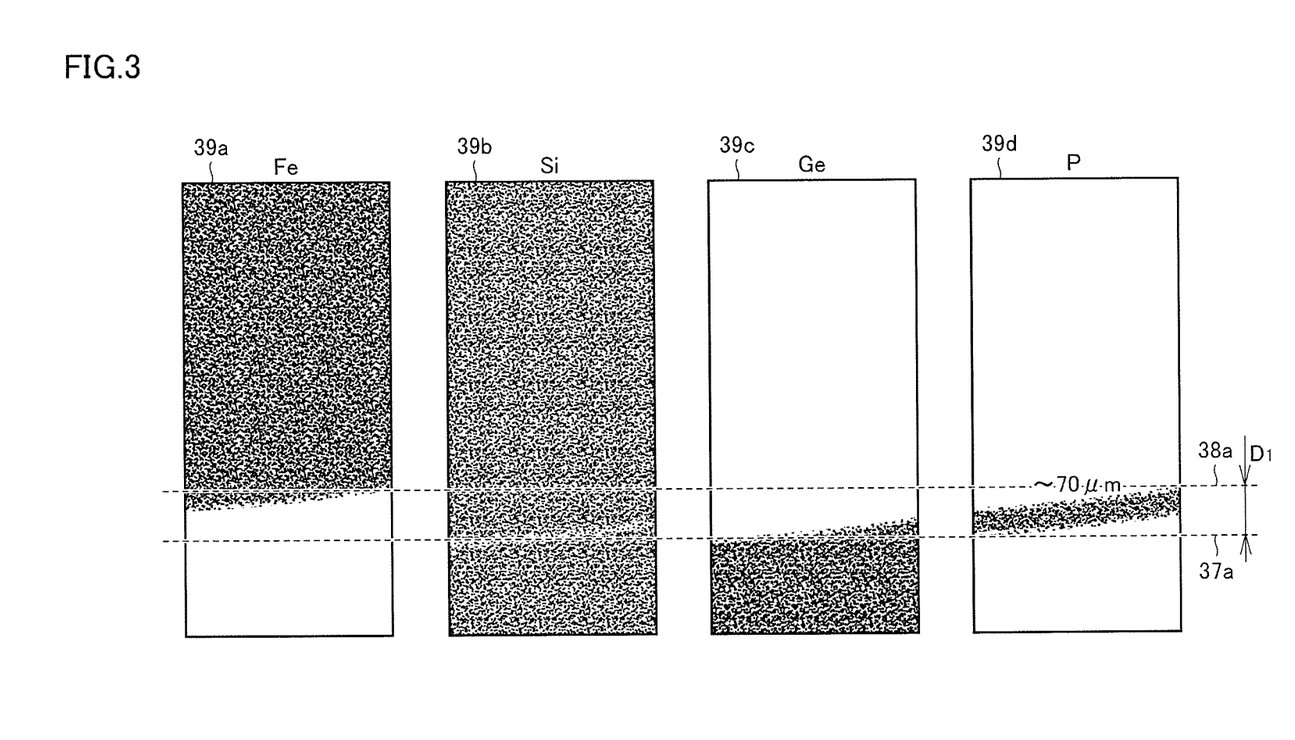
FIG. 3 is a schematic diagram illustrating EDX results in an area around a first layer.

FIG. 3 is a schematic diagram illustrating results of energy dispersive X-ray spectrometry (EDX) in an area around the first layer 31a. For the EDX, transmission electron microscope (TEM) images of a portion of the thermoelectric conversion element 11 were taken for measurement, using JEM-2800 (manufactured by JEOL Ltd.) For the measurement conditions, the acceleration voltage was set to 200 kV, the probe size was set to 0.5 nm, and the CL aperture was set to 3. As to the conditions for detecting atoms with the EDX, EDX (manufactured by Thermo Fisher Scientific K.K.) was used, and for the measurement conditions, the spot size was set to 0.5 nm, the CL aperture was set to 3, the analysis mode was set to mapping, and the analysis time was set to 20 minutes. In FIG. 3, the black dots in an image 39a indicate the distribution state of iron atoms, the black dots in an image 39b indicate the distribution state of silicon atoms, the black dots in an image 39c indicate the distribution state of germanium atoms, and the black dots in an image 39d indicate the distribution state of phosphorus atoms. Each image 39a, 39b, 39c, 39d has a width of 500 μm from the left to the right (in the horizontal direction).

Referring to FIG. 3, the images 39a, 39b, and 39c show that there are many iron atoms above the boundary 38a and there are many germanium atoms below the boundary 37a. The image 39b also shows that the silicon atoms are present throughout the area. The image 39d shows that there are many phosphorus atoms, the dopant, between the boundary 37a and the boundary 38a. In other words, it is confirmed that the first layer 31a, which contains phosphorus as a dopant in a large amount, is formed between the boundary 37a and the boundary 38a. It should be noted that the thickness $D_1$ of the first layer 31a in the present embodiment is 70 μm.

Figure 4:
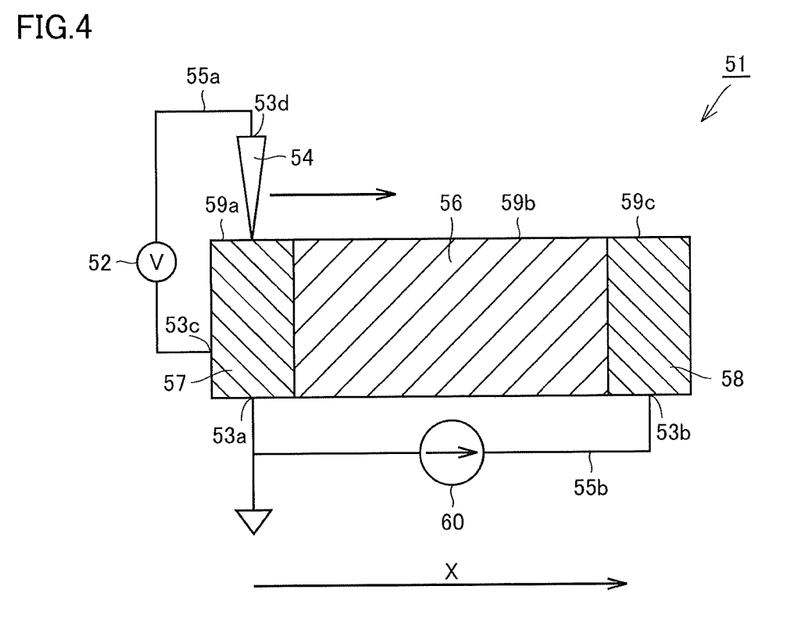
FIG. 4 is a schematic diagram illustrating a measuring device used for measuring interface resistivity.

Here, a method of measuring interface resistivity is described. The interface resistivity is measured using a four-terminal method. FIG. 4 is a schematic diagram illustrating a measuring device used for measuring the interface resistivity. Referring to FIG. 4, the measuring device 51 includes a voltmeter 52, a conductive probe 54, wires 55a and 55b, and a current source 60. A thermoelectric conversion material portion 56, which is the object to be measured, has a block shape, with a first electrode 57 attached to its one end and a second electrode 58 attached to its other end. These members are attached such that the first electrode 57, the thermoelectric conversion material portion 56, and the second electrode 58 have their surfaces 59a, 59b, and 59c continuous with each other. The conductive probe 54 is connected to the first electrode 57 with the wire 55a. The voltmeter 52 is attached to between the conductive probe 54 and the first electrode 57, to measure the voltage between the conductive probe 54 and the first electrode 57. The first electrode 57 is connected to the second electrode 58 with the wire 55b. In the four-terminal method, two terminals 53a and 53b that carry a current from the current source 60 are connected to the first electrode 57 and the second electrode 58, respectively. Of two terminals 53c and 53d used for measuring the voltage in the four-terminal method, one terminal 53c is connected to the first electrode 57, and the other terminal 53d is connected to the conductive probe 54.

In the measurement, in the state where the first electrode 57 and the second electrode 58 are energized, the conductive probe 54, which is in contact with the surface 59a of the first electrode 57, is moved to the surface 59b of the thermoelectric conversion material portion 56 and to the surface 59c of the second electrode 58, for scanning in the direction of the arrow. A voltage is measured by the voltmeter 52 during the scanning with the conductive probe 54, to derive the resistance value from the second electrode 58 to the conductive probe 54. This can ascertain the relationship between a travel distance X and a resistance value R at that time. Then, the resistance value R is differentiated by the travel distance X, and normalized by the cross-sectional area (multiplied by the cross-sectional area), to thereby obtain a cross-sectional resistivity. The interface resistivity is then derived at each position of the interface according to the travel distance X.

Figure 5:
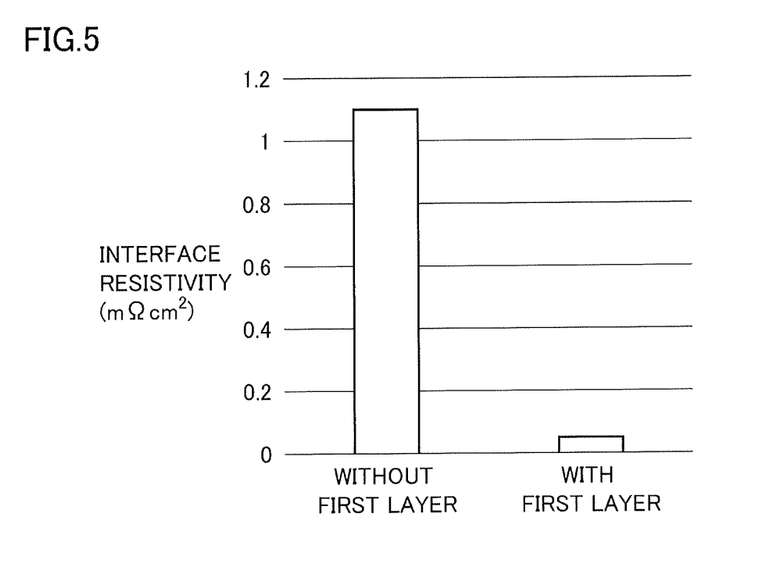
FIG. 5 is a graph illustrating interface resistivity when an intermediate layer includes no first layer and interface resistivity when an intermediate layer includes a first layer.

FIG. 5 is a graph indicating the interface resistivity in the case where the intermediate layer includes no first layer, and the interface resistivity in the case where the intermediate layer includes a first layer. In FIG. 5, the vertical axis represents interface resistivity (m$\Omega$cm$^2$). For the case of an intermediate layer including no first layer, i.e. for the case without the first layer, one produced by bonding the second layer to the thermoelectric conversion material portion by hot pressing was used. Referring to FIG. 5, in the case without the first layer as indicated by the bar graph on the left, the interface resistivity is 1.1 m$\Omega$cm$^2$, which is greater than 0.5 m$\Omega$cm$^2$. In contrast, in the case of the intermediate layer including a first layer as indicated by the bar graph on the right, i.e., in the case with the first layer, the interface resistivity is 0.05 m$\Omega$cm$^2$, which is not less than 0.0001 m$\Omega$cm$^2$ and not more than 0.5 m$\Omega$cm$^2$. This means that the inclusion of the first layer in the intermediate layer included in the thermoelectric conversion element 11 significantly reduces the interface resistivity.

Figure 6:
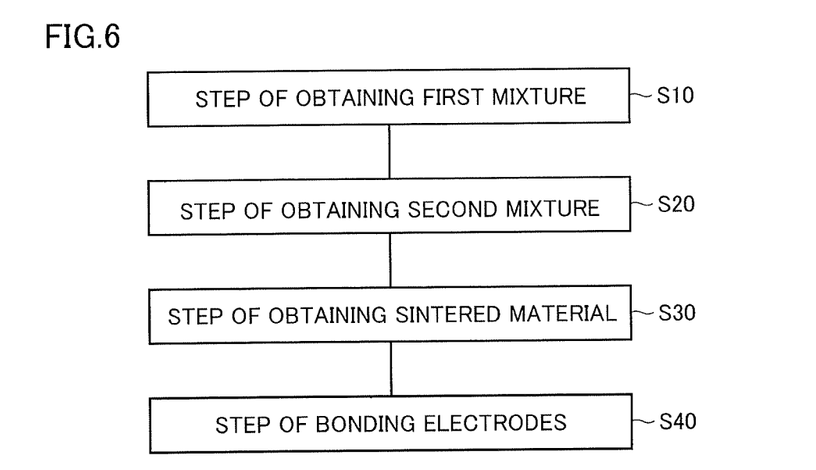
FIG. 6 is a flowchart illustrating representative steps in a method of producing a thermoelectric conversion element in Embodiment 1.

The thermoelectric conversion element 11 according to Embodiment 1 can be produced, for example, in the following manner. FIG. 6 is a flowchart illustrating representative steps in a method of producing the thermoelectric conversion element 11 in Embodiment 1. Referring to FIG. 6, in the method of producing the thermoelectric conversion element 11 in Embodiment 1, a step of obtaining a first mixture is performed as a step S10. In this step S10, first, silicon (Si) powder, germanium (Ge) powder, and phosphorus (P) powder as the powder constituting the dopant of SiGe, which is a semiconductor material, are prepared. Then, predetermined amounts thereof are weighed and milled in a ball mill apparatus, to obtain the first mixture. Here, the P content is set such that it is supersaturated with respect to SiGe. Being contained so as to be supersaturated means that it is contained in an amount greater than the amount that is stoichiometrically incorporated into the crystal. Next, a step of obtaining a second mixture is performed as a step S20. In this step S20, Si powder, and iron (Fe) powder, as raw material powder constituting a layer for suppressing diffusion of elements, are prepared. Then, predetermined amounts thereof are weighed and milled in a ball mill apparatus, to obtain the second mixture. It should be noted that the step S20 and the step S10 may be performed in reverse order.

Figure 7:
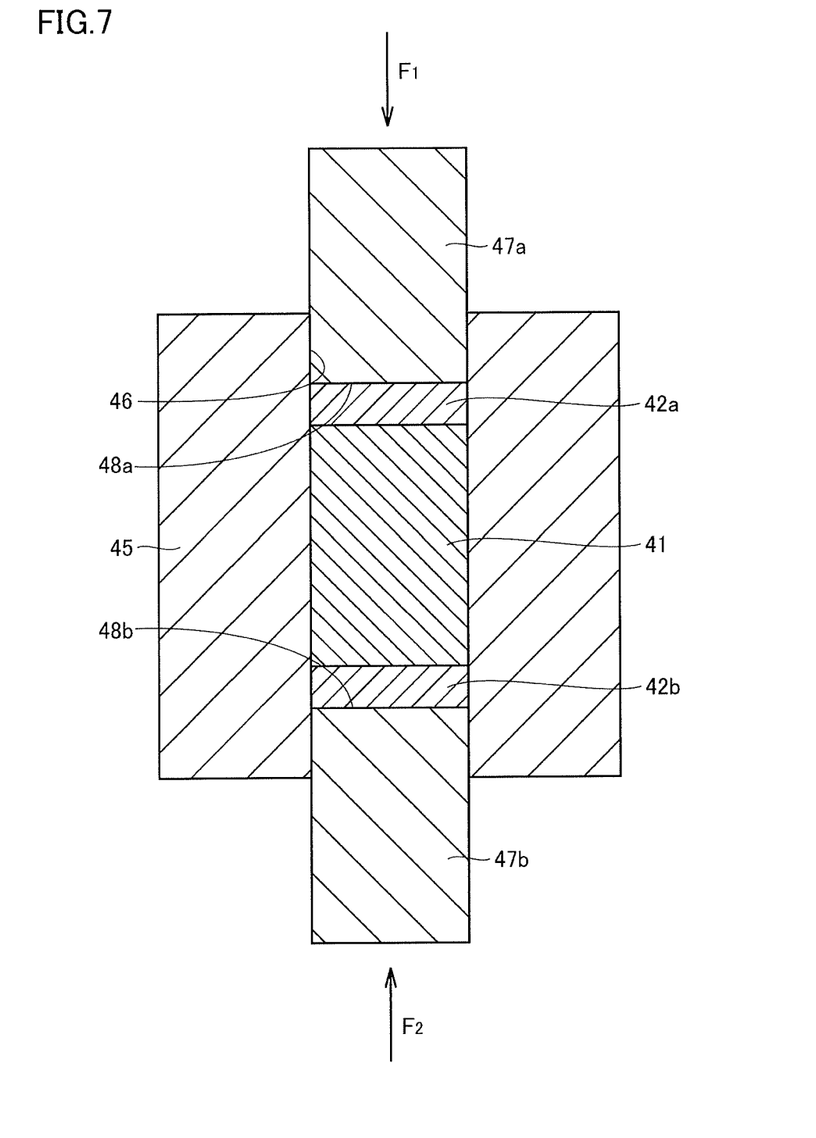
FIG. 7 is a schematic cross-sectional view of a die and punches used in a step of obtaining a sintered material.

Next, a step of obtaining a sintered material is performed as a step S30. In this step S30, first, a hollow cylindrical die and two solid cylindrical punches are prepared. FIG. 7 is a schematic cross-sectional view of the die and punches used in the step of obtaining a sintered material. Referring to FIG. 7, in the sintered material obtaining step, a hollow cylindrical die 45, with a through hole 46 provided, and two solid cylindrical punches 47a and 47b are prepared. For the through hole 46, a diameter of 10 mm, for example, is selected. For the punches 47a and 47b as well, a diameter of 10 mm, for example, is selected. The punches 47a and 47b are configured such that they can be disposed in the through hole 46 of the die 45.

One punch 47b is first placed in the through hole 46, and a second mixture 42b is fed onto one surface 48b of the punch 47b. At this time, the second mixture 42b is fed to have a thickness of about 0.5 mm, for example. Next, a first mixture 41 is fed into the through hole 46. At this time, the first mixture 41 is fed to have a thickness of about 5.0 mm, for example. Thereafter, a second mixture 42a is fed again.

At this time, the second mixture 42a is fed to have a thickness of about 0.5 mm, for example. This results in a state where the first mixture 41 is placed on the second mixture 42b and the second mixture 42a is placed on the first mixture 41 in the through hole 46. In other words, the first mixture 41 is sandwiched between the second mixture 42a and the second mixture 42b in the through hole 46.

Next, as shown in FIG. 7, the other punch 47a is placed on the second mixture 42a. At this time, the punch 47a is arranged such that its one surface 48a is in contact with the second mixture 42a. Thereafter, spark plasma sintering is carried out. That is, the materials are heated with pulse current power utilizing the punches 47a and 47b, while being pressurized with the punch 47a in the direction indicated by the arrow $F_1$ and with the punch 47b in the direction indicated by the arrow $F_2$. At this time, a pressure of about 400 MPa, for example, is selected, and a heating temperature of 700° C., for example, is selected. In this manner, sintering is performed on the materials to obtain a sintered material.

Figure 8:
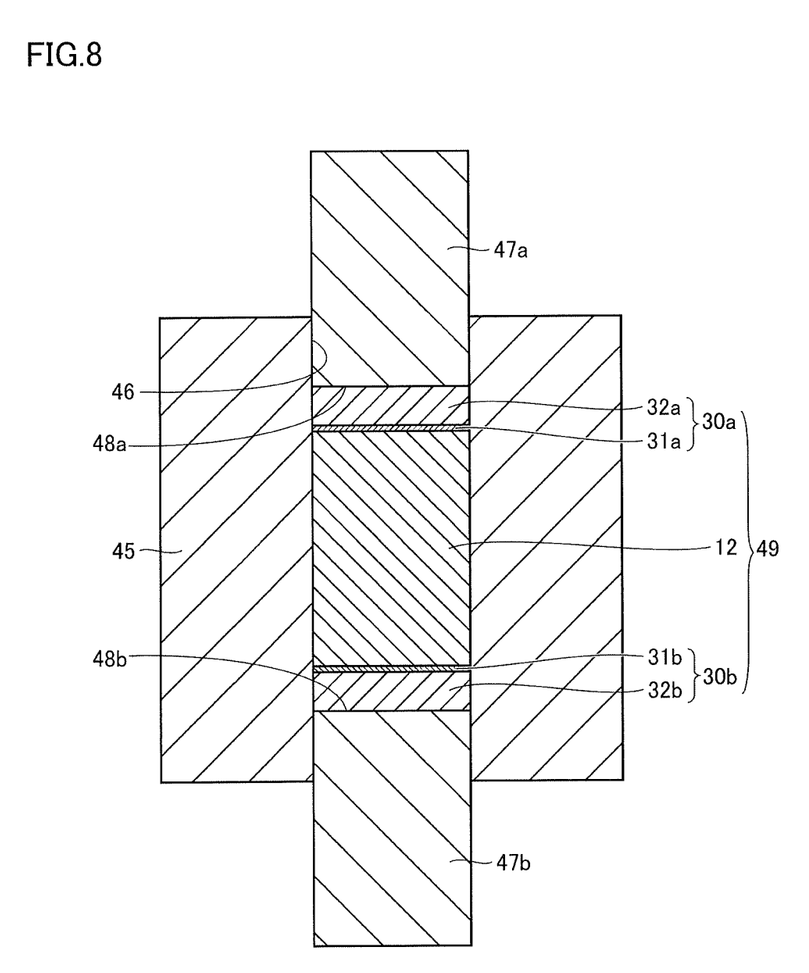
FIG. 8 is a schematic cross-sectional view of an obtained sintered material.

FIG. 8 is a schematic cross-sectional view of an obtained sintered material. Referring to FIG. 8, with the spark plasma sintering, a sintered material 49 is formed, which is composed of a thermoelectric conversion material portion 12, and intermediate layers 30a and 30b that include first layers 31a and 31b and second layers 32a and 32b. Here, when the above-described materials are heated with spark plasma sintering, heat is concentrated at the interfaces between the first mixture 41 and the second mixture 42a and 42b due to interface resistance, causing the dopant element, P, to precipitate. In this case, since the dopant, P, is supersaturatedly dissolved, it easily precipitates at the interfaces. Further, since SiGe has an amorphous phase, P is likely to precipitate near the interfaces, not being taken into the SiGe crystals. With this precipitation, the first layers 31a and 31b having a required thickness are formed. That is, at the interfaces between the second layers 32a and 32b and the thermoelectric conversion material portion 12, the first layers 31a and 31b are formed by P that has been intensively heated and precipitated. In the first layers 31a and 31b, SiGe is doped with P with high concentration, which lowers the electrical barriers between the Fe—Si layers, which are the second layers 32a and 32b, and SiGe, which is the thermoelectric conversion material portion 12, leading to reduced interface resistance. Reduction in interface resistance leads to reduction in electrical resistance, so the heat concentration due to spark plasma sintering is alleviated. Then, the amount of precipitation is suppressed once the resistance is reduced, so the increase in resistance due to excessive precipitation can be suppressed. In the above-described manner, the sintered material 49 is obtained.

Thereafter, a step of bonding electrodes is performed as a step S40. In this step S40, on the sintered material 49 obtained, an Ag—Cu based bonding material 21, 22, 23, 24, for example, is applied and, in the state where a first electrode 14 and a second electrode 15, 16, composed of molybdenum (Mo), are placed thereon, heated up to a temperature of 600 degrees. Through firing of the bonding material 21, 22, 23, 24, the first electrode 14 and the second electrode 15, 16 are mechanically and electrically bonded to the sintered material 49. In this manner, the thermoelectric conversion element 11 in Embodiment 1 is obtained.

According to this method of producing the thermoelectric conversion element 11, the thermoelectric conversion element 11 with the above-described configuration can be produced efficiently.

It should be noted that the method of producing the thermoelectric conversion element 11 is not limited to the above. For example, P powder may be placed in a large amount around the interface between the material constituting the thermoelectric conversion material portion and the material constituting the second layer, to perform sintering.

Furthermore, in the above embodiment, the electrodes may be produced by also preparing powder of the materials for the electrodes and through integral sintering.

While the π type thermoelectric conversion element has been described as an example of the thermoelectric conversion element of the present disclosure in the above embodiment, the thermoelectric conversion element of the present disclosure is not limited thereto. The thermoelectric conversion element of the present disclosure may be a thermoelectric conversion element having another structure, such as an I type (unileg) thermoelectric conversion element, for example. Furthermore, in the above embodiment, at least one of the thermoelectric conversion material portions 12 and 13 may have the above-described configuration.

Embodiment 2

A power generation module as a thermoelectric conversion module can be obtained by electrically connecting a plurality of π type thermoelectric conversion elements 11 described above. A power generation module 61, the thermoelectric conversion module of the present embodiment, has a structure in which a plurality of π type thermoelectric conversion elements 11 are connected in series. It should be noted that the intermediate layers, i.e. the first and second layers, are not illustrated in FIG. 9 for ease of understanding.

Figure 9:
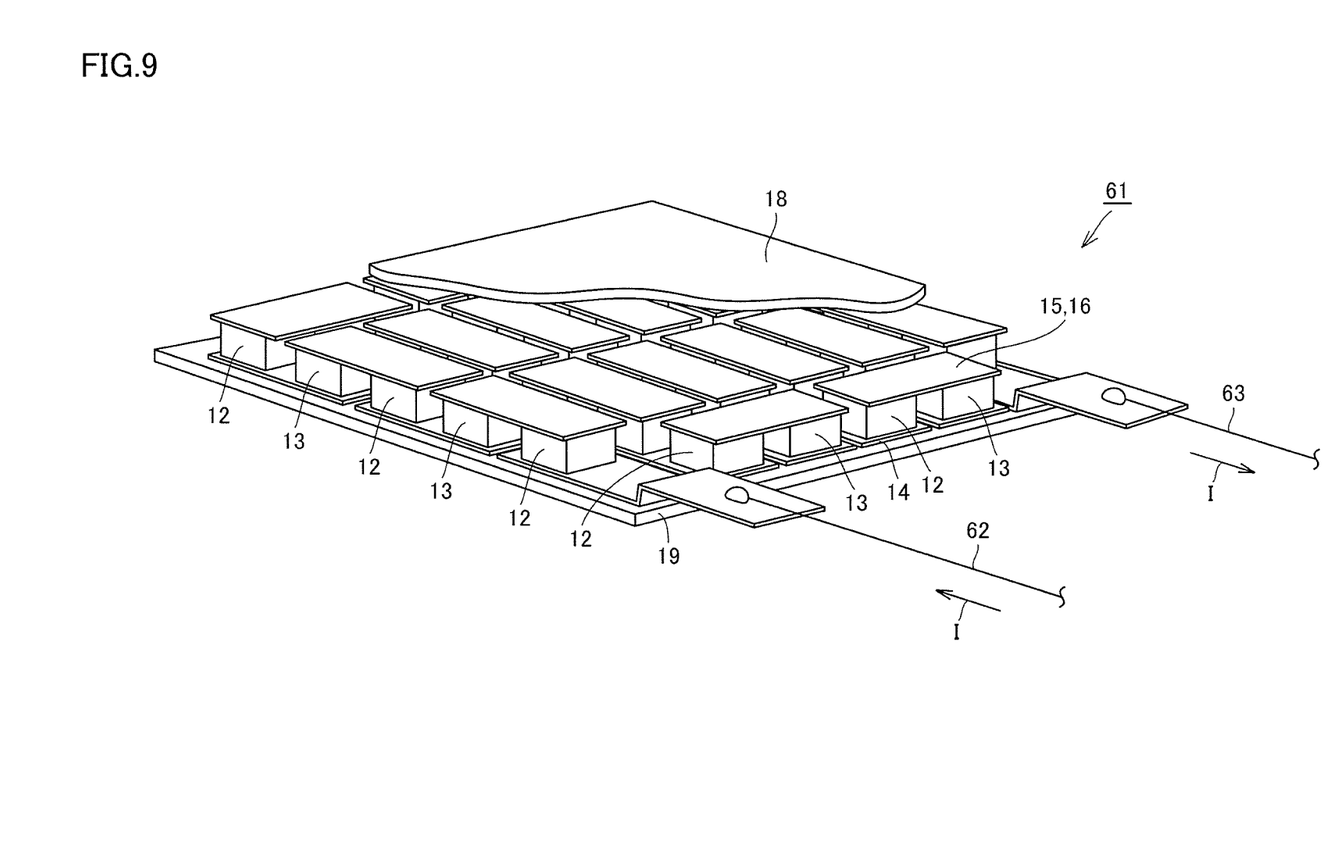
FIG. 9 is a diagram showing an exemplary structure of a power generation module.

FIG. 9 shows an exemplary structure of a power generation module. Referring to FIG. 9, the power generation module 61 of the present embodiment includes a plurality of p type thermoelectric conversion material portions 12, a plurality of n type thermoelectric conversion material portions 13, a plurality of first electrodes 14, a plurality of second electrodes 15, 16, a first insulator substrate 19, a second insulator substrate 18, and a bonding material (not shown) that bonds the thermoelectric conversion material portions 12, 13, the first electrodes 14, and the second electrodes 15, 16 to each other. The first insulator substrate 19 and the second insulator substrate 18 are composed of a ceramic such as alumina.

The p type thermoelectric conversion material portions 12 and the n type thermoelectric conversion material portions 13 are arranged alternately side by side. As in the case of the thermoelectric conversion element 11, the second electrodes 15, 16 are bonded by the bonding material to the p type thermoelectric conversion material portions 12 and the n type thermoelectric conversion material portions 13 via the intermediate layers (not shown). As in the case of the thermoelectric conversion element 11, the first electrodes 14 are bonded by the bonding material to the p type thermoelectric conversion material portions 12 and the n type thermoelectric conversion material portions 13 via the intermediate layers (not shown). A p type thermoelectric conversion material portion 12 is connected to an adjacent n type thermoelectric conversion material portion 13 on one side via a common first electrode 14. This p type thermoelectric conversion material portion 12 is also connected to an adjacent n type thermoelectric conversion material portion 13 on a side different from the above one side via a common second electrode 15, 16. In this manner, all the p type thermoelectric conversion material portions 12 and n type thermoelectric conversion material portions 13 are connected in series.

The second insulator substrate 18 is disposed on a main surface side of the plate-shaped second electrodes 15, 16 opposite to the side that contacts the p type thermoelectric conversion material portions 12 and the n type thermoelectric conversion material portions 13. One second insulator substrate 18 is disposed for the plurality of (all the) second electrodes 15, 16. The first insulator substrate 19 is disposed on a side of the plate-shaped first electrodes 14 opposite to the side that contacts the p type thermoelectric conversion material portions 12 and the n type thermoelectric conversion material portions 13. One first insulator substrate 19 is disposed for the plurality of (all the) first electrodes 14.

Wires 62 and 63 are connected to the first electrodes 14 or the second electrodes 15, 16 bonded to the p type thermoelectric conversion material portion 12 or the n type thermoelectric conversion material portion 13 located at respective ends of the series-connected p type thermoelectric conversion material portions 12 and n type thermoelectric conversion material portions 13. When a temperature difference is formed so that the first insulator substrate 19 side attains a high temperature and the second insulator substrate 18 side attains a low temperature, then the series-connected p type thermoelectric conversion material portions 12 and n type thermoelectric conversion material portions 13 permit a current to flow in the directions of the arrows I, as in the case of the thermoelectric conversion element 11 described above. In this manner, power generation by thermoelectric conversion utilizing temperature differences is achieved in the power generation module 61.

According to this power generation module 61, high thermoelectric conversion efficiency can be achieved by the inclusion of a plurality of thermoelectric conversion elements 11 of the present disclosure capable of achieving high thermoelectric conversion efficiency.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

11: thermoelectric conversion element; 12, 13, 56: thermoelectric conversion material portion; 14, 57: first electrode; 15, 16, 58: second electrode; 17, 55a, 55b, 62, 63: wire; 18: second insulator substrate; 19: first insulator substrate; 21, 22, 23, 24: bonding material; 26, 27, 28, 29: end; 30a, 30b, 30c, 30d: intermediate layer; 31a, 31b, 31c, 31d: first layer; 32a, 32b, 32c, 32d: second layer; 33a, 34a, 35a, 36a: end surface; 37a, 38a: boundary; 39a, 39b, 39c, 39d: image; 41: first mixture; 42a, 42b: second mixture; 45: die; 46: through hole; 47a, 47b: punch; 48a, 48b: surface; 49: sintered material; 51: measuring device; 52: voltmeter; 53a, 53b, 53c, 53d: terminal; 54: conductive probe; 59a, 59b, 59c: surface; 60: current source; 61: power generation module; $D_1, D_2$: thickness; $F_1, F_2, I, Z$: arrow; R: resistance value; and X: travel distance.

The invention claimed is:

1. A thermoelectric conversion element comprising:
   a first electrode;
   a thermoelectric conversion material portion composed of SiGe including an amorphous phase and a crystal phase and configured to convert heat into electricity;

an intermediate layer arranged on the thermoelectric conversion material portion;
a conductive bonding material arranged in between the intermediate layer and the first electrode to bond the first electrode to the intermediate layer; and
a second electrode arranged apart from the first electrode and connected to the thermoelectric conversion material portion,
wherein the intermediate layer includes
a first layer arranged in contact with the thermoelectric conversion material portion, the first layer containing a dopant, and
a second layer arranged on the first layer and in contact with the bonding material, and configured to suppress diffusion of elements,
the intermediate layer having an interface resistivity of not less than 0.0001 mΩcm$^2$ and not more than 0.5 mΩcm$^2$.

2. The thermoelectric conversion element according to claim 1, wherein the dopant includes at least one of P, Fe, Au, B, Ni, V, Ti, Sb, As, Ga, Mo, Y, Cu, and Zr.

3. The thermoelectric conversion element according to claim 1, wherein the dopant has a concentration of not less than 3 at % and not more than 20 at %.

4. The thermoelectric conversion element according to claim 1, wherein the second layer is composed of at least one of iron silicide, nickel silicide, and titanium boride.

5. The thermoelectric conversion element according to claim 1, wherein the first layer has a thickness of not less than 10 nm and not more than 1 mm.

6. A thermoelectric conversion module comprising a plurality of thermoelectric conversion elements, each thermoelectric conversion element according to claim 1.

7. A method of producing a thermoelectric conversion element, comprising the steps of:
obtaining a first mixture by mixing Si powder, Ge powder, and powder constituting a dopant of SiGe as a semiconductor material;
obtaining a second mixture by mixing Si powder and raw material powder constituting a layer configured to suppress diffusion of elements;
obtaining a sintered material by arranging the first mixture on the second mixture and performing spark plasma sintering while maintaining the first mixture and the second mixture at a temperature of not lower than 400° C. and applying a pressure of not less than 20 MPa and not more than 1 GPa; and
bonding electrodes to the sintered material.

8. The thermoelectric conversion element according to claim 2, wherein the dopant has a concentration of not less than 3 at % and not more than 20 at %.

9. The thermoelectric conversion element according to claim 2, wherein the second layer is composed of at least one of iron silicide, nickel silicide, and titanium boride.

10. The thermoelectric conversion element according to claim 3, wherein the second layer is composed of at least one of iron silicide, nickel silicide, and titanium boride.

11. The thermoelectric conversion element according to claim 2, wherein the first layer has a thickness of not less than 10 nm and not more than 1 mm.

12. The thermoelectric conversion element according to claim 3, wherein the first layer has a thickness of not less than 10 nm and not more than 1 mm.

13. The thermoelectric conversion element according to claim 4, wherein the first layer has a thickness of not less than 10 nm and not more than 1 mm.

14. A thermoelectric conversion module comprising a plurality of thermoelectric conversion elements, each thermoelectric conversion element according to claim 2.

15. A thermoelectric conversion module comprising a plurality of thermoelectric conversion elements, each thermoelectric conversion element according to claim 3.

16. A thermoelectric conversion module comprising a plurality of thermoelectric conversion elements, each thermoelectric conversion element according to claim 4.

17. A thermoelectric conversion module comprising a plurality of thermoelectric conversion elements, each thermoelectric conversion element according to claim 5.

* * * * *